United States Patent [19]

Welsh et al.

[11] 4,135,225

[45] Jan. 16, 1979

[54] PIVOTAL STRUCTURAL ENCLOSURE

[76] Inventors: James W. Welsh, 1350 Loring, San Diego, Calif. 92109; Dwight L. Harris, 2012 Camineto Circular Sur, San Diego, Calif. 92037

[21] Appl. No.: 834,795

[22] Filed: Sep. 19, 1977

[51] Int. Cl.$^2$ ............................................. H02B 1/04
[52] U.S. Cl. ................................... 361/382; 312/233; 361/394
[58] Field of Search ................ 339/17, 17 LM, 17 M, 339/17 N; 312/233, 322; 361/331, 340, 380, 382–384, 388, 393, 394, 412, 415, 419, 420

[56] References Cited

U.S. PATENT DOCUMENTS

| | | | |
|---|---|---|---|
| 1,288,681 | 12/1918 | Rice | 312/233 |
| 1,957,800 | 5/1934 | Powell | 312/322 |
| 3,131,330 | 4/1964 | Allen | 361/415 |
| 3,184,645 | 5/1965 | Schaeffer | 361/412 |
| 3,320,488 | 5/1967 | Karew | 361/415 |
| 3,648,113 | 3/1972 | Rathjen | 361/382 |

Primary Examiner—Gerald P. Tolin
Attorney, Agent, or Firm—William W. Haefliger

[57] ABSTRACT

Single or multiple bay systems incorporating electrical or electronic modules mounted in cages attached to pivoted gates. The latter are characterized by, and as having associated therewith.

(a) multiple gates respectively located in multiple interior spaces, the gates having opposed primary and secondary cage sides, (b) means mounting said gates to swing bodily relatively within said interior spaces so that at least a first of said gates has an initial position in a selected bay in which a primary cage side of the first gate faces forwardly, and an alternate position in another interior space in which the opposite cage side of the first gate faces forwardly, (c) at least one of said opposed sides defined by electronic or electric equipment.

21 Claims, 11 Drawing Figures

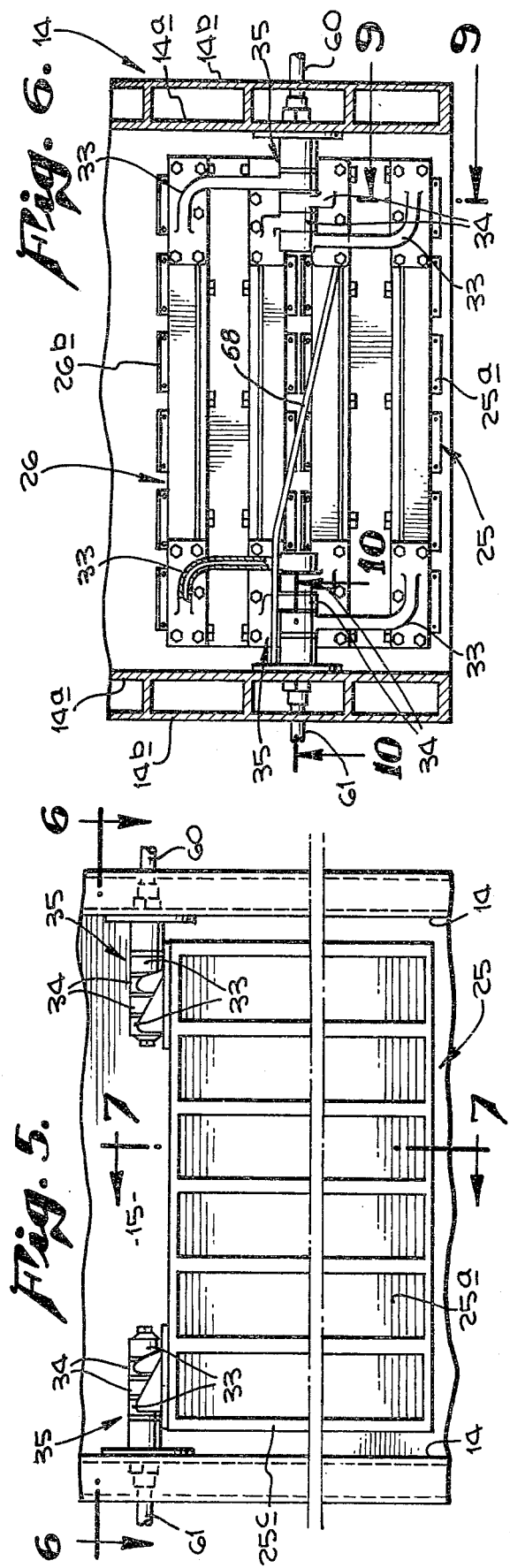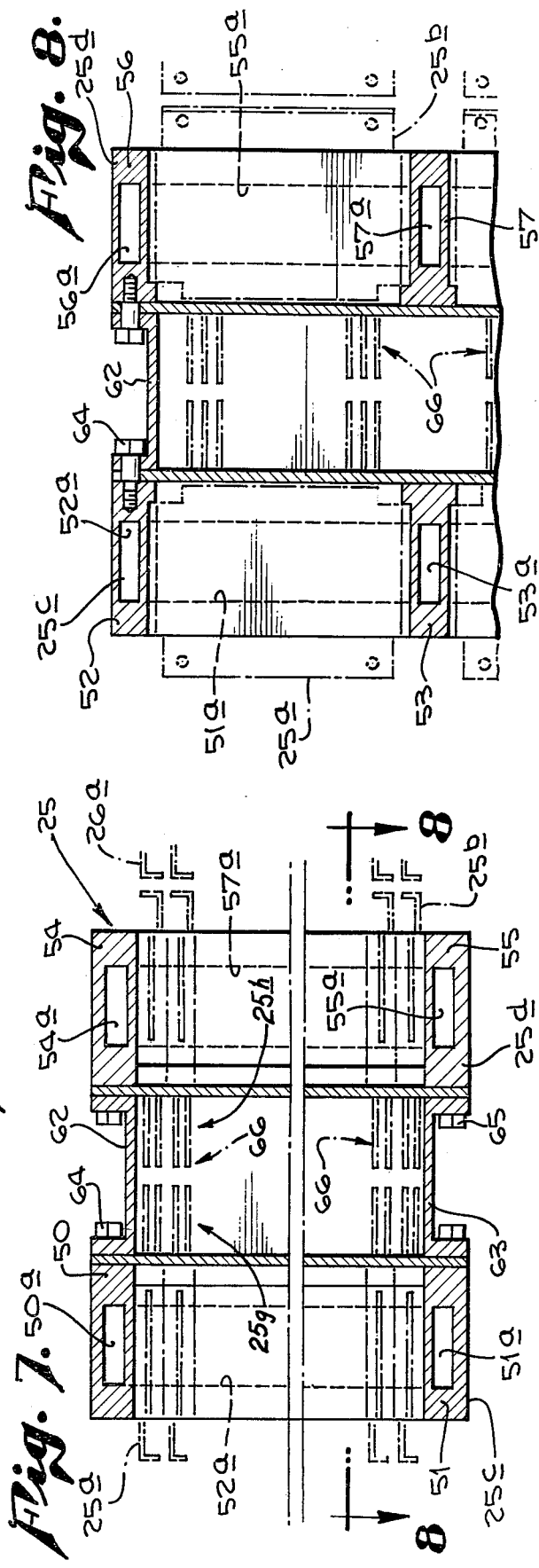

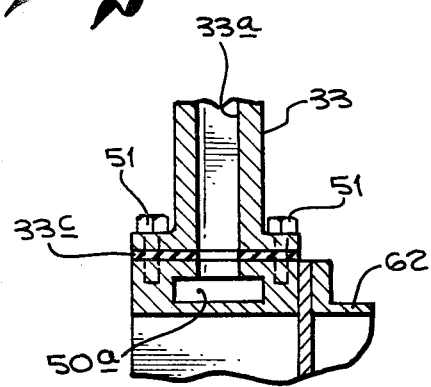
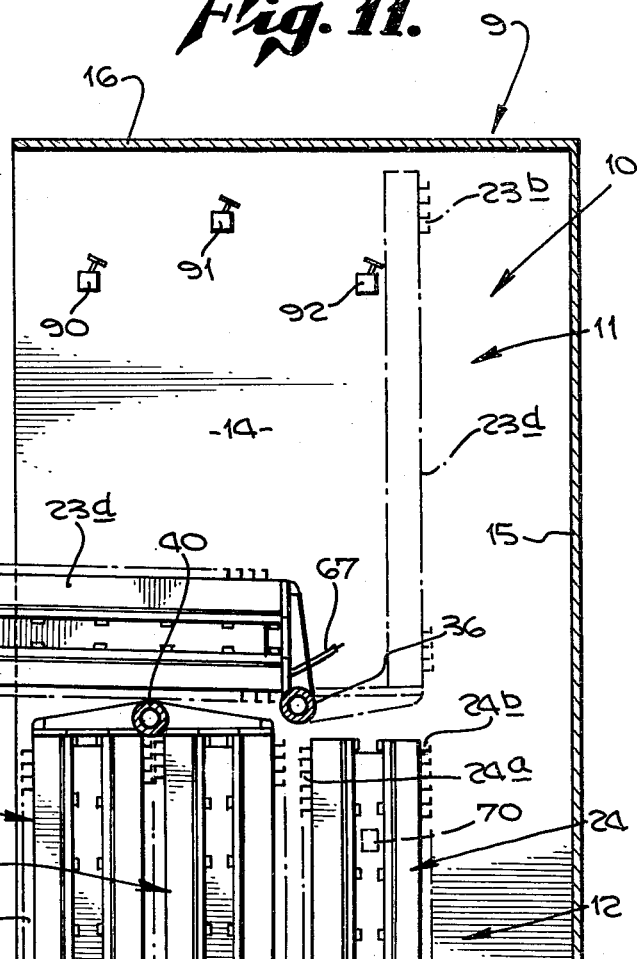
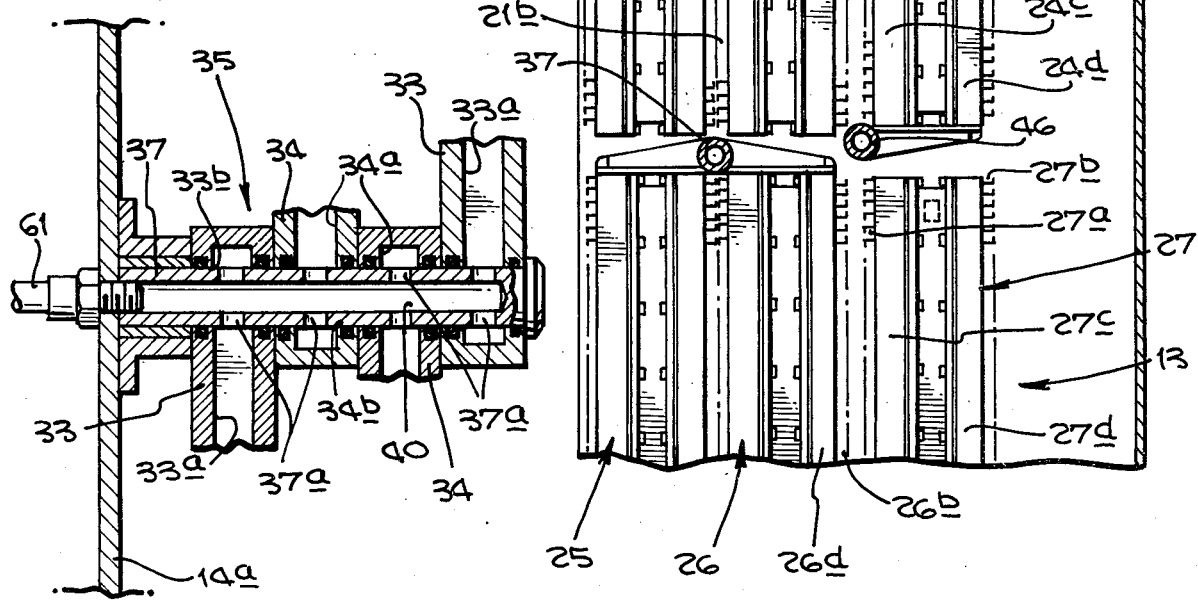

PIVOTAL STRUCTURAL ENCLOSURE

BACKGROUND OF THE INVENTION

This invention relates generally to electronic equipment packaging systems, and more particularly concerns a unique bay system incorporating provisions to accept electrical or electronic modules installed in cages or chasis which are bodily movable within each bay to provide unobstructed access to all modules.

There is a great need for a standardized, integrated packaging of electronic equipment for shipboard, submarine and avionic use. In the past, contractors for the most part have separately developed different packaging systems for each application, or resorted to commercial systems. Structural evaluations of commercial packaging systems have proven them generally unsatisfactory for shipboard use, and, in most cases, after extensive redesign, they still fail to meet performance requirements of applicable military specifications. In spite of excessive time and money spent in contractor designed packaging systems, there are few which actually withstand the rigorous Navy shock and vibration conditions. Virtually no existing packaging systems permit extended operation in the shipboard environments while they are opened for maintenance or service.

SUMMARY OF THE INVENTION

It is a major object of the invention to meet the above needs through the provision of both single and multiple bay systems incorporating electronic or electrical modules in bodily swingable cages within the bays to provide unobstructed access to front and back sides of all cages. Further objects include the provision of convenient, fully accessible serviceable interior spaces for input/output and power connections and filters, internal wiring and power supplies; high module densities and increased heat load capacities and thermal inertia, simplified, free-standing system installations and module and cage retention hardware; providing the electronic modules and all supporting structure increased survivability in shock and vibration environments. These advantages contribute to significant gains in functional performance, size and weight reduction maintainability, reliability and cost effectiveness.

Basically, the invention is embodied in a system that includes (a) multiple electrical or electronic modules respectively located in cages providing suitable module mounting rails with guides and module retention, supporting structure, and pin connector plates in multiple bays, the cages having opposed primary and secondary sides; and, (b) means mounting the cages to swing bodily relatively within the bays so that at least a first of the electronic modules has an initial position on a selected cage and is accessible and faces frontwardly, and an alternate cage position in the same bay as for instance above or below the initial position in which the opposite (pin connector) side of the first electronic modules faces frontwardly. As will be seen, a second of the electronic modules may typically have an initial position on an adjacent cage swinging about a common axis in the selected bay in which the forward facing pin connector side of the second modules is exposed when the first cage is swung into its alternate position, i.e., the connector side of the second modules is hidden until the first cage is swung out of the initial position into the alternate position within the bay. Further, the second electronic modules may become accessible when the second cage is bodily rotated into its alternate position (again adjacent to the first cage) in which its opposite (modules) side faces forwardly exposing the second electronic modules; the first electronic modules and pin connectors of both cages then being concealed behind the second cage. In this way both front (modules) sides and back (pin connector) sides of both cages may be sequentially exposed through a process of selective bodily swinging of the cages between their initial and alternate positions. These principles may be applied to from three to sixteen or more pivoting cages per bay. Two oppositely facing cages rotating about a common pivot center comprise a gate with electronic modules outwardly facing on both sides. Three or more gates (six or more cages) may be rotated about a single pivot center. Also, access to all the internal space and the rear, top and bottom interior surfaces of the bay or enclosure confining the modules may be achieved, solely from the front of that enclosure, through selective swinging of the module cages and gates.

Additional objects include the provision of pivot shaft means, and rotatable arm structures interconnecting the shaft means with one or more electronic module cages, swinging about the same pivot shaft, the provision of passages in the pivot shafts, interconnecting arms and module rails in the cages to pass fluid or gaseous coolant to and from the modules; and the provision of pre-loaded, releasable locking elements to retain the electronic modules in the cages, and the cages within the bays and also to restrain each of them against excessive relative motion of deflection under shock and vibration excitations from any orientation relative to the cabinet.

These and other objects and advantages of the invention, as well as the details of an illustrative embodiment, will be more fully understood from the following description and drawings, in which:

DRAWING DESCRIPTION

FIG. 5 is a fragmentary frontal elevation taken on lines 5—5 of FIG. 1;

FIG. 6 is a plan view, taken in section, on lines 6—6 of FIG. 5;

FIG. 7 is an elevation taken in section on lines 7—7 of FIG. 5;

FIG. 8 is a plan view taken in section on lines 8—8 of FIG. 7;

FIG. 9 is an elevation taken in section on lines 9—9 of FIG. 6;

FIG. 10 is an elevation on lines 10—10 of FIG. 6; and

FIG. 11 is a view like FIG. 1, but showing rotatable cages in another of several alternate positions.

DETAILED DESCRIPTION

Figure 1:
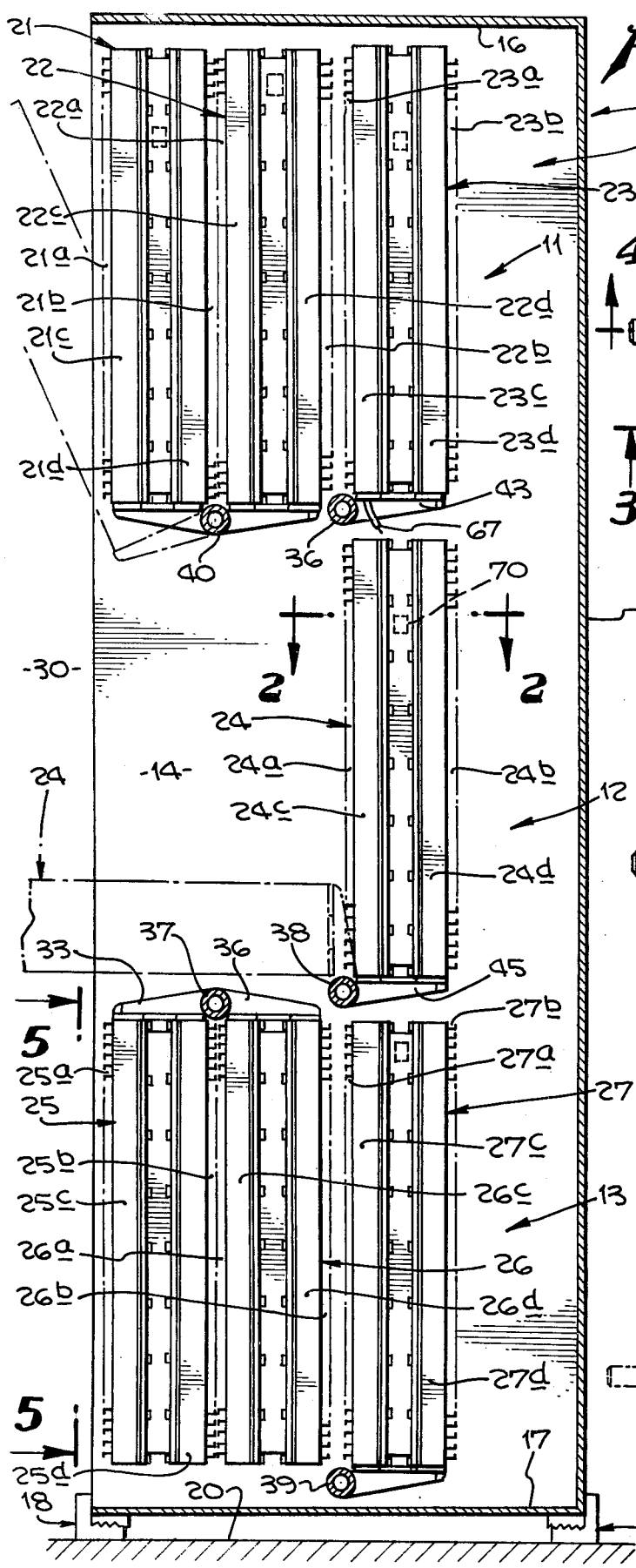
FIG. 1 is an interior elevation, looking to the left side taken in section, showing a typical embodiment with electronic modules installed in a system of multiple cages rotatable about pivot shafts in accordance with the invention.

Referring first to FIG. 1, the multiple gate system 10 for example includes seven gates in upper, intermediate and lower cages in spaces 11–13 within an upright cabinet 9 having upright side walls 14, rear wall 15, and top and bottom panels 16 and 17. The cabinet is secured by bolts 18 through the lower terminations of side wall structural members 14a–d to a floor or deck 20. Upper and lower gate spaces 11 and 13 are respectively located above and below intermediate gate space 12.

In accordance with the invention, multiple gates in which electrical or electronic modules are respectively located in pairs of oppositely facing cages occupy each of the several positions, cages having opposed primary (module) and secondary (pin connector) sides. For example, gates 21–23 are located in upper space 11, in front to rear sequence; a single gate 24 is located in intermediate space 12 directly beneath gate 23; and gates 25–27 are located in lower space 13, in front to rear sequence. Further, the gates have opposed cages comprising primary and secondary sides, as for example in FIG. 1 gate 21 a primary cage is indicated at 21a with modules facing forward and a secondary cage is indicated at 21b with modules facing rearward. Similar opposed sides for the remaining gates appear as back-to-back cages at 22a, 22b–27a, 27b. Such sides may typically be occupied by plug-in electronic modules indicated at 21c, 21d–27c, 27d carrying circuit components, printed circuits, wiring or power supply elements on the module frames which are electrically continuous with multiple pin connectors penetrating the connector plates 21e, 21f–27e, 27f. An enlarged view of the pin connectors 25g and 25h relationship to the gate and cage elements is seen for gate 25 in FIGS. 7 and 8.

Further in accordance with the invention, means is provided mounting the gates (two back-to-back cages) to swing bodily relatively within the bay so that at least a first of the electronic modules are accessible from the front 30 of the system for maintenance, removal or insertion, in which a primary side of the first gate faces frontwardly (see for example modules in the primary cage side 21a of gate 21 facing frontwardly in space 11 in FIG. 1); and an alternate gate position directly below gate 22 forward of gate 24 in which the opposite side of the first gate faces frontwardly (see for example modules in the secondary cage side 21b of gate 21 facing frontwardly in space 12 in FIG. 11). In the illustrated embodiment, at least a second of the modules (as for example those on gate 22) has an initial position in the selected bay (space 11 for example) in which the primary cage side 22a of the second gate 22 is forwardly exposed when the first gate 21 is swung into alternate position as above. Thus, for example, when first gate (in broken lines, FIG. 1) 21 is swung downward 180° into intermediate space 12 forward of gate 24, as seen in FIG. 11, the primary cage side 22a of gate 22 is forwardly exposed, simultaneous. Access is accordingly, provided from the front 30 of the system to the electronic or electrical equipment (modules) removable front the primary cage side 22a of gate 22, and to the electronic or electrical equipment (modules) removable from the secondary cage side 21b of gate 21.

The second gate 22 also has an alternate position 180° below its initial position in the other (intermediate) space 12 forward of the gate 21 alternate position in which the opposite (secondary) cage side 22b of that gate faces frontwardly and is forwardly exposed and electronic modules thereon are accessible as is clear from FIG. 11. The first gate 21 is at that time concealed behind the second gate 22. Therefore, both sides of the two gates 21 and 22 are sequentially accessible, via selective swinging of the two gates about a common pivot between spaces 11 and 12. The same principles and functions are applicable to the two gates 25 and 26 in space 13, through selective swinging thereof about their common pivot between spaces 13 and 12.

Third gate 23 also located in the selected upper space 11, has its primary cage side 23a forwardly exposed and accessible when the first and second gates 21 and 22 are both swung downwardly into their alternate positions in intermediate space 12, as in FIG. 11. To gain access to the opposite (secondary) cage side 23b of gate 23, it is swung downwardly 90° to the horizontal position represented in FIG. 11. Unencumbered access to the rear and upper interior of the cabinet in space 11 is then possible. Simultaneous access to the pin connector sides of both cages 23a and 23b is achieved by independently swinging the primary cage 23a downward 90° to project horizontally. While secondary cage 23b remains vertically oriented in space 11 (as shown with broken lines in FIG. 11). Access to the pin connector sides of gate 24 in intermediate space 12 and gate 27 in lower space 13 is accomplished similarly.

It should also be noted that when the two gates 21 and 22 are in space 11 and gates 25 and 26 in space 13 are swung upwardly into space 12, the primary cage side 27a of gate 27 in space 13 is forwardly exposed; and gate 27 then may be swung downwardly 90° to project horizontally (in the manner of gate 23 in FIG. 11) to upwardly expose its rear or secondary cage side 27b. Unencumbered access to the rear and lower interior of the cabinet in space 13 is then possible. When the gates are positioned as in FIG. 1, gate 24 located in the intermediate space 12 has its primary cage side 24a forwardly exposed and may be swung downwardly 90° to project horizontally as seen in broken lines 24' in FIG. 1, thereby to upwardly expose its secondary cage side 24b. Unencumbered access to the intermediate rear interior of the cabinet in space 12 is then possible. Thus it is sequentially possible to have full visibility of and access to all of the interior spaces and surfaces of the cabinet.

The above referenced means mounting the gates to bodily swing independently advantageously includes pivot shaft means, supporting arm structures connected with the cage frames for rotating (swinging) movement between initial and alternate positions. In the FIG. 6 example, first long reach and second short reach arm structures are respectively associated with the gates 25 and 26, i.e. first (long reach) arms 33 connected with primary cage frame 25a at opposite sides of the gate 25; and with secondary cage frame 26b at opposite sides of gate 25; second (short reach) arms 34 connected with secondary cage frame 25b at opposite sides of gate 25; and with primary cage frame 26a at opposite sides of gate 26. All the first and second arms associated with gates 25 and 26 are rotatable about a common axis defined by the two separate inward facing pivot shafts 37 respectively connected, with opposite side wall structural members 14a of the cabinet. Walls 14 may also include exterior wall panels 14b cooperating with interior wall structural members 14a to form a rigid, high strength connection directly to the deck as previously noted. Note that the arms 33-34 are transversely offset so as to allow swinging of all the gates or cages into all combinations of their initial and alternate positions without interference. This is achieved by inverting the orientation and order of assembly for the first (long reach) and second (short reach) arm structures. Similarly, and as seen in FIG. 1, identical arm structures connected with cage frames 21a, 21b, and cage frames 22a and 22b at opposite sides of gates 21 and 22 respectively are rotatable about the common axis defined by the two separate inwardly facing pivot shafts 35 associated with those gates. The cages on the three rearward gates 23, 24 and 27 are also connected to the enclosure side wall 14 with identical first (long reach) and second (short reach) arm structures and are rotatable (through 90°) about the three axes respectively defined by the two inwardly facing pivot shafts 36, 38 and 39 associated with each of those gates.

In accordance with a further aspect of the invention, the hollow pivot shafts and rotatable arms and cage frames define intercommunicating passages for containing and passing fluid or gaseous coolant in heat transfer or cooling relation with the electronic modules. For example, and as shown in FIGS. 5, 6, 7, 8, 9 and 10, the pivot shaft 37 is hollow to define a passage 40, arm structures 33 and 34 are hollow to define passages 33a and 34a and incorporate supporting sections to form bearings 33b and 34b about shaft 37, the bearings and arms defining a continuation of passages 33a and 34a each of which communicate with the shaft passage 40 via multiple ports 37a. In FIG. 10, the passage 33b in hollow arm 33 (which communicates with shaft passage 40 via multiple ports 37a) communicates with horizontal and transverse cage passage 50a in horizontal and transverse upper cage rail 50 of cage frame 25c. Cage rail 50 is attached to the arm 33 as via fasteners 51 sealed with a suitable interfacing gasket material 33c. In FIG. 7, cage passage 50a, is shown communicating with horizontal and transverse cage passage 51a in lower cage rail 51 via vertical ducts or passages 52a and 53a in vertical cage rails 52 and 53. The latter are better seen in FIG. 8. Corresponding passages in arms at the opposite transverse side of the gate intercommunicate cage passages 50a and 54a with cage passage 40 in the pivot shaft 37 at that end of the gate. Coolant inlet and outlet ducts to the pivot shafts appear at 60 and 61. FIGS. 7 and 8 also show structural elements 62 and 63, and the fasteners 64 and 65 interconnecting the cage frames 25c and 25d, and also enclosing electrical elements such as pins 66.

External electrical connections to the modules may be made via cables terminated in electronic module frames. Flat (ribbon) cable extending proximate the pivot shafts, interconnecting and combination of gates through simple bending as indicated for example at 67 in FIG. 1. Alternatively, heavier wire and/or coaxial cable can be routed from either side of the enclosure to the opposite side of any gate (68 FIG. 6). The flexure of the cable during rotation of the gates is primarily torsional with a slight bending.

Figure 2:
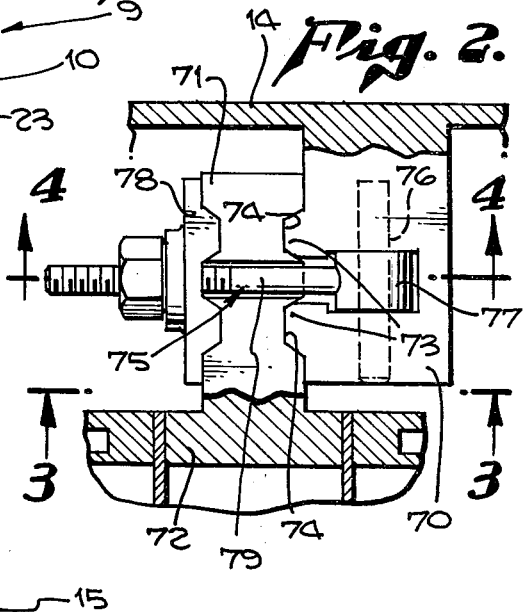
FIG. 2 is an enlarged fragmentary plan view, taken in section, on lines 2—2 of FIG. 1.
Figure 3:
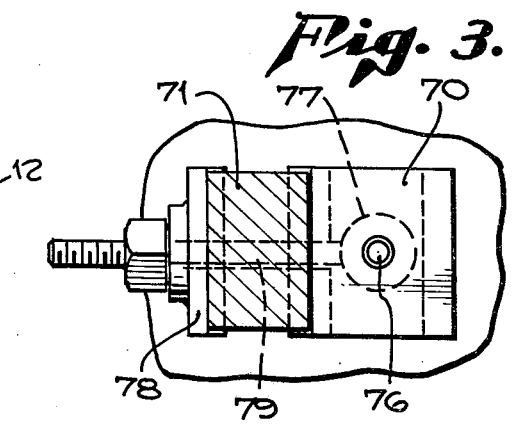
FIG. 3 is a fragmentary section taken on lines 3—3 of FIG. 2.
Figure 4:
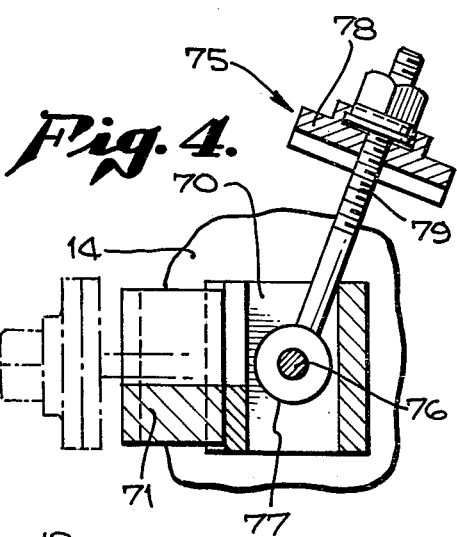
FIG. 4 is a fragmentary section taken on lines 4—4 of FIG. 2.

Finally, releasable locking elements are provided to positively retain the swingable gates in their initial and alternate positions in the spaces within the enclosure bay. In the example shown in FIGS. 2-4, the locking elements include a stop 70 carried by the cabinet side wall 14 to project into bay 12, and a part 71 carried by gate 24 (as for example by rail 72 of that gate) to engage the stop. The interengagement surfaces may have preloaded conical or tongue and groove interfit as at 73 and 74 to retain the gate laterally front-to-rear and sideways against vibratory movement relative to the stop and cabinet. Vertical displacement between the gate and the cabinet stop is resisted by preloaded conical or horizontal tongue and groove or the high friction forces between vertical tongue and groove interengagement surfaces. A swingable latch 75 is carried by the wall 14, as via pivot 76 and latch bearing 77. The latch has a hold position, as seen in FIGS. 2 and 3, in which the latch washer 78 on latch arm 79 blocks movement of the part 71 laterally forward away from (i.e. leftward in FIGS. 2-4) the stop 70 and cabinet. Note that the washer 78 may have tongue and groove interfit with the part 71, in that position, to provide increased bearing areas and aid in blocking lateral vibratory movement of the module relative to the cabinet. Further, the latch has a pivoted release position, as seen in FIG. 4, in which part 71 is free to move away from the stop, in a forward direction, in response to selective swinging of the gates, as previously described.

It should be noted that gate stop 71 has an eccentric profile on both oppositely facing surfaces to provide desired interengagement in both initial and alternate positions. Each single interface on the gate is matched by the receivers on the cabinet, one at each position.

Finally, the following advantages are noted:

1. By stopping the gates at the *horizontal* position (mid-way between initial and alternate positions) accessibility is provided to the left and right and top *cage faces* of the gate—existing systems do not permit unobstructed access to all but one of the six faces of a rectilinear gate or chassis due to chassis slides, latch handles 2. By stopping the gates at any position between the initial and alternate positions an orientation which is optimum for accessibility and/or visual alignment can be achieved thus facilitating maintenance by providing maximum human factors accommodation.

3. The fact that each removable electronic module is very firmly gripped in the cage guide rails that the cages and gates are mechanically locked-up with large heavily loaded interface areas to the cabinet which in turn is joined to the deck with many large heavily loaded interface areas provides a thoroughly homogenous structural and thermal system where all the structures masses are connected through efficient mechanical and thermally conductive joints. While requisite for structural reasons this imparts a hugh thermal inertia to the system which tends to stabilize transient temperature fluctuations and greatly extends the capability to continue operating the equipment at full power after a cooling system casualty.

4. The concept works with two positions-initial and alternate (180° apart) and can be expanded to three, four or five intermediate positions without any basic modifications.

5. Besides the seven gate system illustrated there are at least six major variations with as few as four gates to more than ten gates combined with up to four fixed cages. The variations plus the capability to accept conventional (state-of-the-art) electronic system packaging as well as the proposed pivoting gates system makes transition between existing and future systems easy and economically feasible.

I claim:

1. In a system incorporating electrical equipment mounted in cages attached to pivoting gates, (a) an enclosure and multiple gates respectively located in multiple interior spaces in the enclosure, the spaces including first, second and third such spaces in a row, the second space located intermediate the first and third spaces, the gates having opposed primary and secondary cage sides, (b) means mounting said gates to swing bodily relatively within said interior spaces so that at least a first of said gates has an initial position in said first space in which a primary cage side of the first gate faces forwardly, and an alternate position in said second interior space in which the opposite cage side of the first gate faces forwardly, and a second of said gates has an initial position in said first space in which a primary cage side of the second gate is forwardly exposed when said first gate is swung into said alternate position in said second interior space, there also being gates in said third space and which are swingable into said second space, (c) at least one of said opposed sides defined by electric equipment.

2. The system of claim 1 including releasable locking elements carried by the enclosure to retain the gates in both positions in the interior spaces.

3. The system of claim 1 wherein said second gate also has an alternate position in the second interior space in which the opposite cage side of said second gate faces forwardly and is forwardly exposed, the first gate then being in the second interior space and concealed behind the second gate.

4. The system of claim 1 wherein a third gate in said second space has an alternate position in which it projects horizontally forward in the swing path between the first and third spaces.

5. The system of claim 1 wherein said first, second and third spaces are vertically separated, the second space openly exposed to the first and third spaces, and there being at least two gates in each of the first and third spaces.

6. The system of claim 5 wherein there are three of said gates in said first space, two of the gates in the first space having a common axis of rotation, and the third gate in said first space having another axis of rotation parallel to said common axis.

7. The system of claim 6 wherein there are three of said gates in said third space, two of the gates in the third space having a common axis of rotation, and the third gate in the third space having another axis of rotation parallel to said common axis.

8. The system of claim 7 wherein there is a single gate in the second space with an axis of rotation parallel to the axes of rotation of said gates in said first and third spaces, but staggered relative to a vertical plane through said common axes of rotation.

9. The system of claim 1 including means to internally cool the gates in all positions thereof.

10. The system of claim 3 wherein a third of said gates is in the first space, the primary side of the third gate being frontwardly exposed when said first and second gates are in the second space.

11. The system of claim 10 wherein there are at least three of said gates in each of at least two of said spaces, said gates having parallel axes of rotation.

12. The system of claim 10 wherein said third gate has an alternate position in which it projects horizontally forward in the first space to expose the secondary cage side of the third gate when the first and second gates are in the second space.

13. The system of claim 1 wherein an additional gate is located in the second space to be concealed behind the first and second gates in their alternate positions in the second space, and to be forwardly exposed when the first and second gates are in the first space.

14. The system of claim 13 wherein the additional gate has an alternate position in which it projects forwardly in said second space to expose the secondary cage side of the additional gate when the first and second gates are in said first space.

15. The system of claim 1 wherein each gate includes a cage frame, and said mounting means comprises pivot shaft means, and arm structures connected with said cage frames and supported for swinging movement by said shaft means.

16. The system of claim 3 wherein each gate includes a cage frame, and said mounting means comprises pivot shaft means, and arm structures connected with said cage frames and supported for swinging movement by said shaft means, said arm structures including first and second arms respectively associated with said first and second gates, said first and second arms rotatable about a common axis defined by said pivot shaft means.

17. The system of claim 16 wherein said arm structures include a third arm rotatable about an axis spaced rearwardly of a vertical plane through said common axis.

18. In a system incorporating electrical equipment, mounted in cages attached to pivoting gates, (a) an enclosure and multiple gates respectively located in multiple interior spaces in the enclosure, the gates having opposed primary and secondary cage sides, (b) means mounting said gates to swing bodily relatively within said interior spaces so that at least a first of said gates has an initial position in a selected space in which a primary cage side of the first gate faces forwardly, and an alternate position in another interior space in which the opposite cage side of the first gate faces forwardly, (c) at least one of said opposed sides defined by electric equipment, (d) each gate including a cage frame, and said mounting means comprising pivot shaft means, and arm structures connected with said cage frames and supported for swinging movement by said shaft means, the pivot shaft means, arms and cage frames defining intercommunicating passages to pass fluid or gaseous coolant in heat transfer relation with the electric equipment.

19. The system of claim 18 wherein the pivot shaft means include coaxial hollow shafts respectively carried by the enclosure, said shafts defining inlet and outlet passages for said coolant, the shaft passages being in communication via said arm passages and cage frame passages.

20. In a system incorporating electrical equipment mounted in cages attached to pivoting gates, (a) an enclosure and multiple gates respectively located in multiple interior spaces in the enclosure, the gates having opposed primary and secondary cage sides, (b) means mounting said gates to swing bodily relatively within said interior spaces so that at least a first of said gates has an initial position in a selected space in which a primary cage side of the first gate faces forwardly, and an alternate position in another interior space in which the opposite cage side of the first gate faces forwardly, (c) at least one of said opposed sides defined by electric equipment, (d) there being a stop carried by an enclosure wall to project into a space, a part carried by a gate to engage the first stop, and a swingable latch carried by said wall and having a hold position in which the latch blocks movement of said part away from the stop, and a release position in which said part is free to move away from said stop in response to bodily swinging of a gate.

21. The system of claim 20 wherein said part has tongue and groove interfit with at least one of the latch and the stop, in said hold position of the latch.

* * * * *